(12) United States Patent
Bonaria

(10) Patent No.: US 6,967,474 B2
(45) Date of Patent: Nov. 22, 2005

(54) DEVICE FOR POSITIONING AN ELECTRONIC TEST HEAD WITH RESPECT TO A MANIPULATOR FOR MANIPULATING ELECTRONIC COMPONENTS, IN PARTICULAR INTEGRATED CIRCUITS

(75) Inventor: Luciano Bonaria, Turin (IT)

(73) Assignee: SPEA S.p.A, Volpiano (IT)

(*) Notice: Subject to any disclaimer, the term of this patent is extended or adjusted under 35 U.S.C. 154(b) by 108 days.

(21) Appl. No.: 10/652,616

(22) Filed: Sep. 2, 2003

(65) Prior Publication Data

US 2004/0108846 A1    Jun. 10, 2004

(30) Foreign Application Priority Data

Sep. 6, 2002   (IT)   ............... TO2002A0783

(51) Int. Cl.$^7$ ........................... G01R 31/02
(52) U.S. Cl. .................................. 324/158.1
(58) Field of Search ............ 324/158.1, 73.1, 324/765; 73/866.5; 33/573–574; 248/650–652; 414/589–590

(56) References Cited

U.S. PATENT DOCUMENTS 5,241,870 A * 9/1993 Holt ........................ 73/866.5
5,450,766 A * 9/1995 Holt ........................ 73/866.5
6,006,616 A * 12/1999 Baker ....................... 73/866.5

* cited by examiner

*Primary Examiner*—Vinh P. Nguyen
(74) *Attorney, Agent, or Firm*—Nath & Associates PLLC; Gregory B. Kang; Teresa M. Arroyo

(57) ABSTRACT

A device for positioning an electronic test head with respect to a manipulator for manipulating electronic components, in particular integrated circuits, includes a supporting structure fitted to a base, a frame to which the electronic head is connectable, and an actuating assembly for moving the frame with respect to the supporting structure; the base has a number of shoes, e.g. compressed-air shoes, cooperating with a supporting surface; when idle, the base rests on the supporting surface by means of the shoes; when compressed air is supplied to the shoes, the shoes are raised vertically by a few microns with respect to the supporting surface; in which condition, the device is supported hydrostatically and substantially weightlessly with respect to the supporting surface, and the whole device can easily be moved manually by the operator in any direction parallel to the supporting surface.

10 Claims, 3 Drawing Sheets

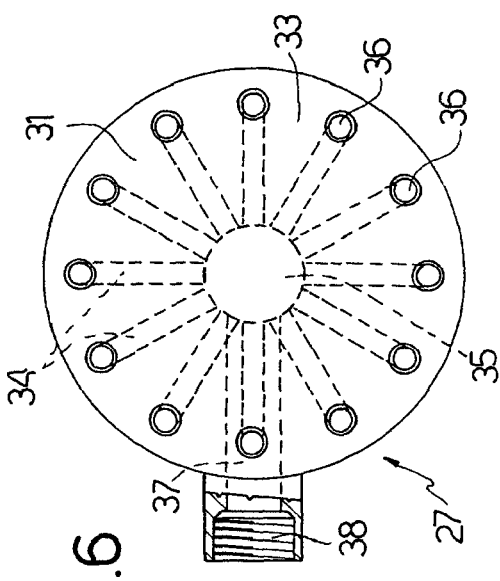
Fig.6
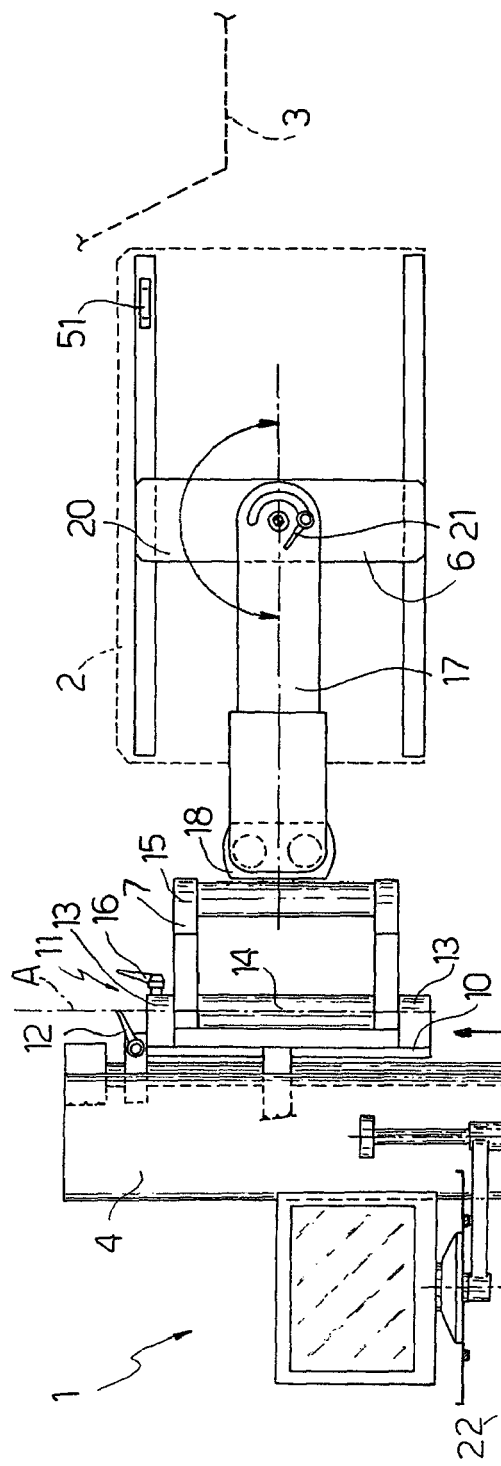
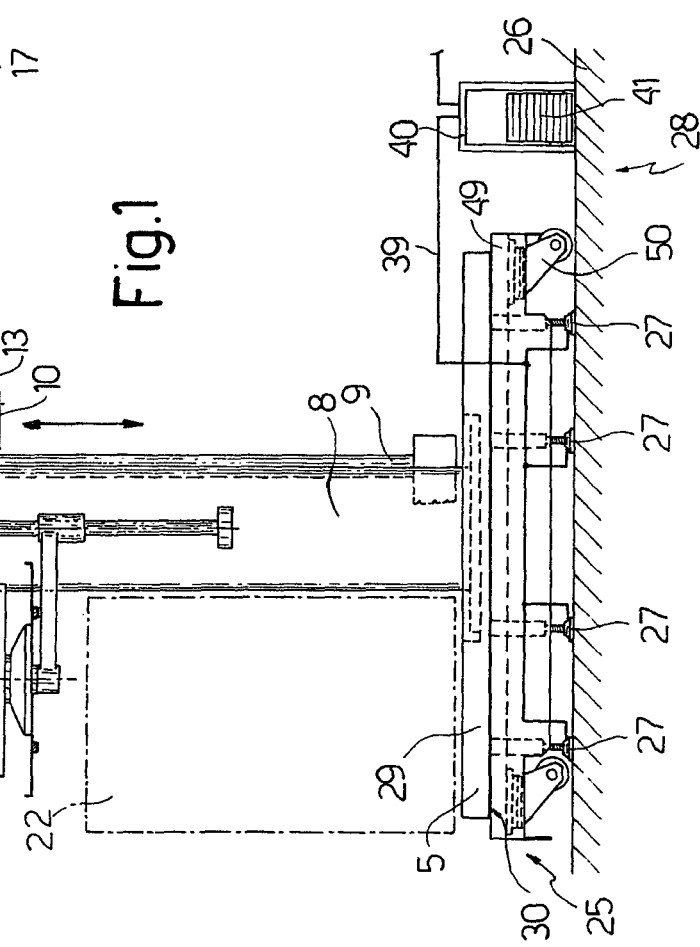
Fig.1

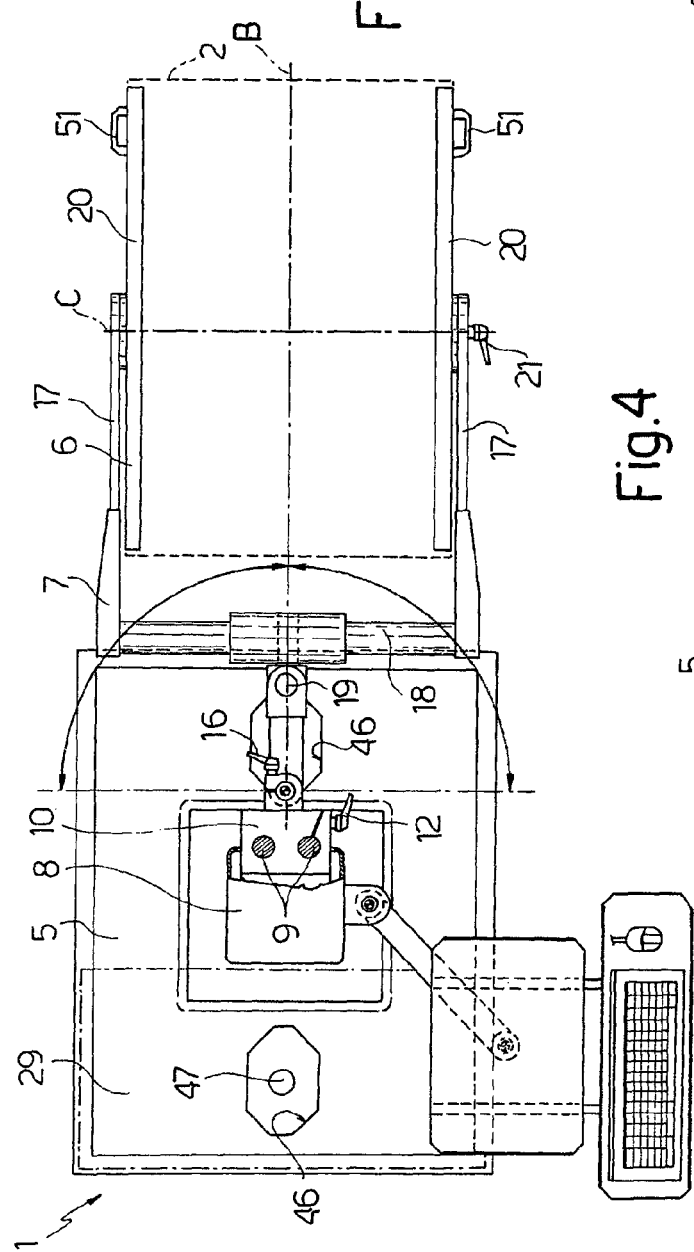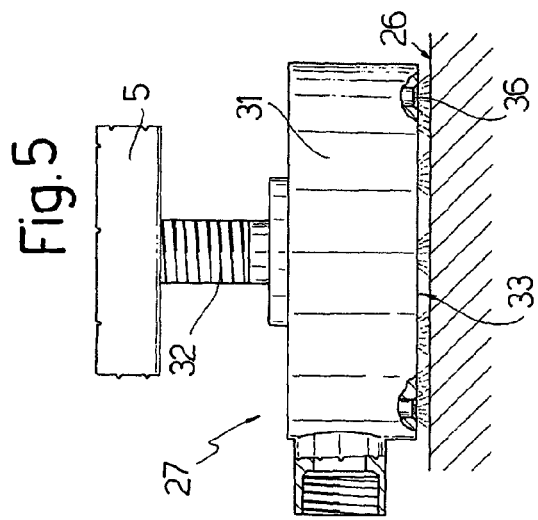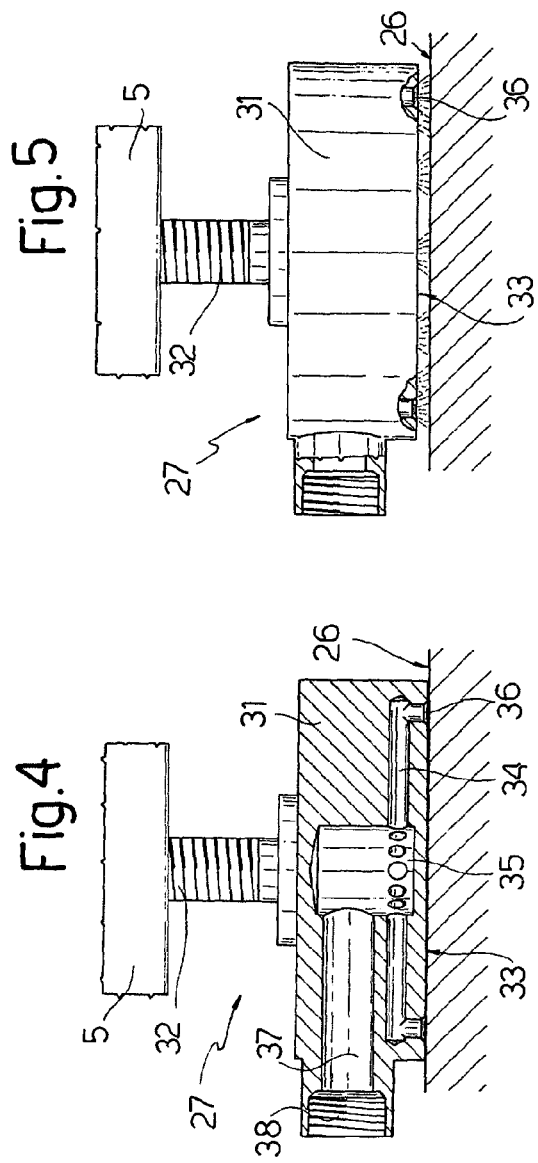

DEVICE FOR POSITIONING AN ELECTRONIC TEST HEAD WITH RESPECT TO A MANIPULATOR FOR MANIPULATING ELECTRONIC COMPONENTS, IN PARTICULAR INTEGRATED CIRCUITS

The present invention relates to a device for positioning an electronic test head with respect to a manipulator for manipulating electronic components, in particular integrated circuits.

BACKGROUND OF THE INVENTION

Automatic testing of integrated circuits and other electronic components is performed using devices of the type illustrated, for example, in European Patent Application EP-A-0102217, which comprises a fixed supporting structure fitted with a positioning assembly in turn fitted with an electronic test head. The positioning assembly slides vertically with respect to the supporting structure, and can also be extended horizontally in an accordion-like movement along three parallel axes to position the electronic head correctly with respect to the test component or circuit carried by a manipulator. Each moving component of the positioning assembly has a lock lever mechanism, and the electronic test head is positioned manually by an operator working separately on each moving component of the positioning assembly, after releasing the corresponding lock lever mechanism. Once set to the required position, each moving component is again locked.

The above device, and others like it, have various drawbacks. In particular, positioning the electronic test head is a slow, painstaking job, by the operator having to work on a number of separate moving components and respective lock lever mechanisms. Moreover, the positioning assembly comprises a large number of moving components, and is therefore fairly complex and expensive to produce and assemble.

SUMMARY OF THE INVENTION

It is an object of the present invention to provide a device for positioning an electronic test head with respect to an electronic component manipulator, designed to eliminate the aforementioned drawbacks of the known art, and which, in particular, permits accurate, fast, easy positioning of the electronic head, while at the same time being relatively cheap and easy to produce as a whole.

According to the present invention, there is provided a device for positioning an electronic test head with respect to a manipulator for manipulating electronic components, in particular integrated circuits, as claimed in claim 1.

The device according to the invention permits extremely fast, easy positioning of the electronic head, by requiring of the operator, as will be seen, only a small number of operations which are much easier to perform as compared with those of the known devices described above. Moreover, as compared with known solutions, the device according to the invention comprises fewer moving parts, and is therefore simpler in design and cheaper and easier to produce as a whole.

BRIEF DESCRIPTION OF THE DRAWINGS

A number of non-limiting embodiments of the present invention will be described by way of example with reference to the accompanying drawings, in which:

FIG. 1 shows a side view of a positioning device in accordance with the invention;

FIGS. 2 and 3 show, respectively, a front view and partly sectioned top plan view of the FIG. 1 device;

FIGS. 4 and 5 show two larger-scale, partly sectioned, schematic side views of a shoe forming part of the FIG. 1 device and shown in respective work positions;

FIG. 6 shows a schematic, bottom plan view of the FIGS. 4 and 5 shoe;

DETAILED DESCRIPTION OF THE INVENTION

Figure 2:
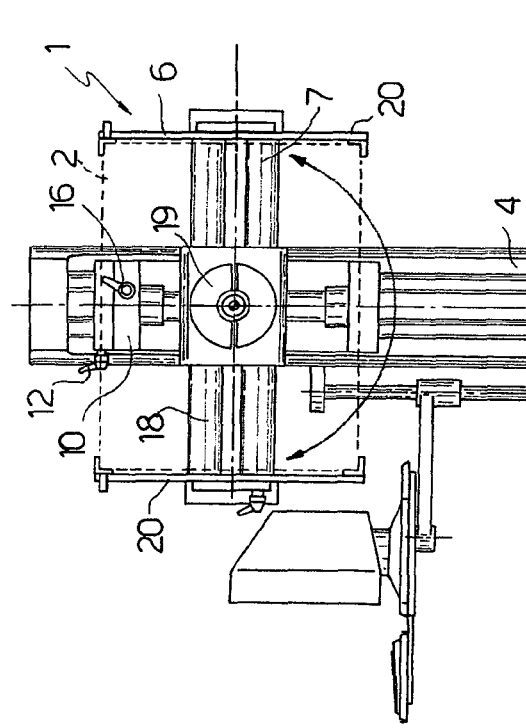

Number 1 in FIGS. 1 to 3 indicates as a whole a device for positioning an electronic test head 2 (known and only shown schematically by a dash line) with respect to a manipulator 3 (also known and only shown by a dash line in FIG. 1) for manipulating electronic components, in particular integrated circuits.

Device 1 comprises a supporting structure 4 fitted to a base 5; a frame 6 to which electronic head 2 is connectable; and an actuating assembly 7 for moving frame 6 with respect to supporting structure 4.

Supporting structure 4 comprises a vertical column 8 fixed to base 5 and having two parallel, vertical, cylindrical guides 9; actuating assembly 7 comprises a slide 10 mounted to run along guides 9, and an arm mechanism 11 fitted integrally to slide 10; and a known releasable lock lever mechanism 12 is associated with slide 10 to lock slide 10 in a predetermined position with respect to column 8.

Arm mechanism 11 comprises two end supports 13, between which extends a shaft 14 parallel to guides 9 and defining a rotation axis A; a bracket 15, supporting frame 6, is hinged to shaft 14; and a known releasable lock lever mechanism 16 is provided to prevent rotation of bracket 15 with respect to axis A and so secure bracket 15 integrally to shaft 14.

Frame 6 comprises two parallel arms 17 connected by a cross member 18; cross member 18 is connected for rotation to bracket 15 by a known joint 19 allowing frame 6 to rotate with respect to bracket 15 about an axis B perpendicular to axis A; arms 17 have respective H-shaped fastening plates 20 connected for rotation to arms 17 about a common axis C; a releasable lock lever mechanism 21 selectively prevents rotation of at least one of fastening plates 20 with respect to arms 17; and electronic head 2 is insertable between and connectable integrally to fastening plates 20 in known manner not described for the sake of simplicity, and is connectable in known manner to a known processing unit 22 (only shown by a dot-and-dash line in FIG. 1) equipped with a monitor and keyboard.

Column 8 houses a known balancing system not shown for the sake of simplicity, and of the type described, for example, in Patent Application EP-A-0102217.

Device 1 also comprises retaining means 25 by which base 5 cooperates with, and is movable in any direction parallel to, a supporting surface 26. More specifically, retaining means 25 permit rotation and translation of base 5 in a plane parallel to supporting surface 26, and so maintain base 5 substantially floating on supporting surface 26. Base 5, in fact, is secured to supporting surface 26 in a direction perpendicular to supporting surface 26, but is movable in any direction parallel to supporting surface 26, and in particular rotates and translates in a plane parallel to supporting surface 26.

In the example shown, base 5 is secured to supporting surface 26 by the full weight of device 1 resting on supporting surface 26, and retaining means 25 comprise a number of shoes 27 resting on supporting surface 26 and associated with actuating means 28 for selectively locking and releasing shoes 27 with respect to supporting surface 26.

More specifically, base 5 comprises a substantially flat plate 29 having a bottom surface 30; shoes 27 project from and are arranged in a predetermined pattern on bottom surface 30; shoes 27 are pressurized-fluid-jet, in particular compressed-air, shoes; and actuating means 28 are pneumatic actuating means for releasing shoes 27 from supporting surface 26 by emitting pressurized fluid, in particular compressed air.

As shown in detail in FIGS. 4 to 6, each shoe 27 comprises a substantially disk-shaped foot 31 fitted to a free end of a rod 32, and has a substantially flat contact surface 33—defined, in the example shown, by a bottom surface of foot 31—which rests on supporting surface 26. Rod 32 is advantageously threaded, and is associated with a known adjusting mechanism (not shown for the sake of simplicity) for adjusting the distance between shoe 27 and bottom surface 30 of base 5.

A number of conduits 34 are formed in each foot 31, radiate from a common central diffuser 35, and terminate with respective nozzles 36 formed on contact surface 33 and arranged in a ring close to a peripheral edge of foot 31; and central diffuser 35 is connected, by a channel 37 and a fitting 38, to a compressed air (or other pressurized fluid) supply system 39 only shown schematically in FIG. 1.

Supply system 39 is equipped with a control unit 40 for selectively supplying and cutting off compressed air to and from shoes 27. Control unit 40 is located on supporting surface 26 or in any other user-convenient position, and is activated, for example, by a pedal 41: compressed air is supplied to shoes 27 when pedal 41 is pressed, and is cut off from shoes 27 when pedal 41 is released.

Figure 7:
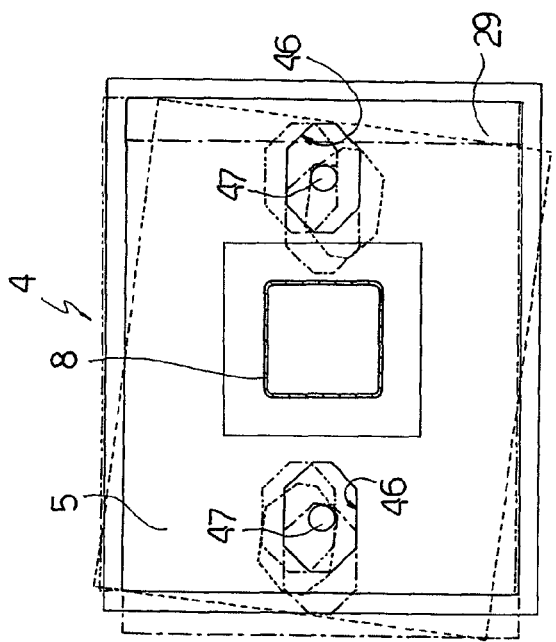
FIG. 7 shows a partial top plan view of a further detail of the FIG. 1 device.

With reference to FIGS. 2, 3 and 7, device 1 also comprises guide means 45 for guiding base 5 and limiting the travel of base 5 on supporting surface 26. More specifically, guide means 45 comprise two octagonal slots 46 formed through plate 29 and engaged by respective pins 47 projecting perpendicularly from supporting surface 26.

It is understood that supporting surface 26 may be defined by a floor of the premises housing device 1, or by a bottom wall of a member 48 (only shown schematically by a dot-and-dash line in FIG. 2) such as a tank specially designed to house device 1.

Base 5 (FIGS. 1 and 2) also comprises a frame 49 surrounding a peripheral edge of plate 29 and having four auxiliary pull-out wheels 50 (known).

Device 1 operates as follows.

When idle, base 5 rests on supporting surface 26 by means of contact surfaces 33 of shoes 27. And, since the full weight of device 1 rests on contact surfaces 33, base 5 is secured to, and device 1 prevented from moving on, supporting surface 26.

To move electronic head 2 (connected to frame 6 and to processing unit 22) into the required position with respect to manipulator 3, the operator presses pedal 41 of control unit 40 to activate supply system 39 and supply shoes 27 with compressed air, which, issuing at high pressure from nozzles 36, detaches contact surfaces 33 from supporting surface 26 (FIG. 5). Supply system 39 and nozzles 36 are so designed that the compressed air jets from nozzles 36 are sufficient to raise device 1 vertically, and to position and keep contact surfaces 33 at a distance of a few microns (roughly 10 to 50 $\mu$m and, in particular, about 30 $\mu$m) off supporting surface 26. In which condition, device 1 is supported hydrostatically and substantially weightlessly with respect to supporting surface 26. The weight of device 1, in fact, is substantially balanced by the thrust of the compressed air jets from nozzles 36.

The whole of device 1 can thus be moved easily by hand, e.g. by the operator gripping handles 51 (FIGS. 1 and 3) fitted to fastening plates 20 or in any other appropriate position on supporting structure 4. Excessive movement of device 1 is prevented by guide means 45, as shown clearly in FIG. 7, in which the dash lines show respective positions that can be assumed by plate 29 of base 5 with respect to pins 47 (fixed to supporting surface 26).

Once device 1 is set to the required position with respect to manipulator 3, the operator releases pedal 41 to cut off compressed air supply to shoes 27, so that base 5 once more rests on supporting surface 26.

Further adjustments to the position of electronic head 2 can be made using actuating assembly 7 in the usual way.

To move device 1 over greater distances, wheels 50 are used, which, when extracted, keep shoes 27 detached 15 from supporting surface 26, even when supply system 39 is off.

Figure 8:
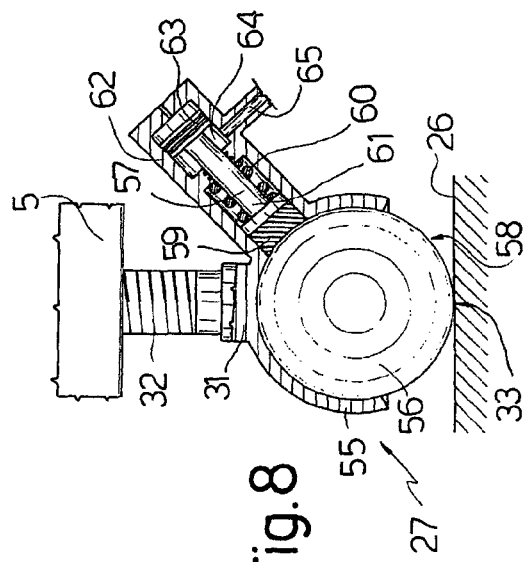
FIG. 8 shows a partly sectioned side view of a variation of the FIGS. 4 and 5 shoe.

In the FIG. 8 variation, which is otherwise identical with the above embodiment, shoes 27 are rolling-body shoes. In this variation, too, each shoe 27 comprises a foot 31 fitted to a free end of a rod 32 and having a contact surface 33 resting on supporting surface 26. In this case, however, each foot 31 comprises a shell 55 housing for rotation at least one rolling body 56, in particular a ball, associated with a release brake 57. Base 5 rests on supporting surface 26 by means of rolling bodies 56, and the contact surface 33 by which each shoe 27 cooperates with supporting surface 26 is defined by a spherical lateral surface 58 of respective rolling body 56.

Brake 57 associated with each rolling body 56 comprises a block 59, which is held resting against surface 58 of rolling body 56 by a spring or other elastic member 60 to prevent rolling body 56 from rolling on supporting surface 26. More specifically, block 59 is carried by a piston 61 housed in axially sliding manner inside a cylinder 62 integral with shell 55; and a head 63 of piston 61, at the opposite end to block 59, is housed inside a chamber 64 connected by a conduit 65 to a compressed air supply system 39 (identical with the one described with reference to FIG. 1) equipped with a control unit 40 for selectively supplying and cutting off compressed air to and from shoes 27.

The variation described operates in exactly the same way as described above. When idle, base 5 rests on supporting surface 26 by means of contact surfaces 33 of shoes 27. Since brakes 57 engage respective rolling bodies 56, base 5 is secured to, and device 1 prevented from moving on, supporting surface 26. When the operator presses pedal 41 (FIG. 1), supply system 39 is activated to detach blocks 59 from respective rolling bodies 56 in opposition to elastic members 60, and so release brakes 57. At which point, device 1 can be moved easily on supporting surface 26, and, once positioned, the operator releases pedal 41 to cut off compressed air supply to shoes 27, and brakes 57 again engage respective rolling bodies 56.

Each shoe 27 may obviously comprise a number of rolling bodies 56, and different types of rolling bodies 56, e.g. wheels or rollers, may be provided.

Clearly, changes may be made to the device as described and illustrated herein without, however, departing from the scope of the present invention.

What is claimed is:

1. A device (1) for positioning an electronic test head (2) with respect to a manipulator (3) for manipulating electronic components, including integrated circuits, comprising:
    a supporting structure (4) fitted to a base (5);
    a frame (6) to which the electronic head (2) is connectable; and
    an actuating assembly (7) for moving the frame (6) with respect to the supporting structure (4);
    retaining means (25) by which said base (5) cooperates with a supporting surface (26) and is movable in any direction parallel to said supporting surface (26);
    actuating means (28) are pneumatic actuating means, which release said shoes (27) from the supporting surface (26) by emitting a pressurized fluid;
    characterized in that said retaining means (25) secure the base (5) to the supporting surface (26) in a direction substantially perpendicular to the supporting surface (26), and permit rotation and translation of the base (5) in a plane parallel to the supporting surface (26); and
    characterized in that said retaining means (25) comprise a number of shoes (27) resting on the supporting surface (26) and associated with actuating means (28) for selectively locking the shoes (27) with respect to the supporting surface (26) and releasing the shoes (27) from the supporting surface (26).

2. A device as claimed in claim 1, characterized in that said shoes (27) are pressurized-fluid-jet shoes.

3. A device as claimed in claim 2, characterized in that each of said shoes (27) has a contact surface (33) cooperating with said supporting surface (26) and having a number of nozzles (36) connected to a supply system (39) supplying pressurized fluid.

4. A device as claimed in claim 3, characterized in that said nozzles (36) are arranged in a ring and connected to a common central diffuser (35) by respective radial conduits (34).

5. A device as claimed in claim 1, characterized in that said shoes (27) are rolling-body shoes.

6. A device as claimed in claim 5, characterized in that each of said shoes (27) comprises at least one rolling body (56) associated with a release brake (57).

7. A device as claimed in claim 6, characterized in that said release brake (57) comprises a block (59) held resting against a surface (58) of the rolling body (56) by an elastic member (60) to prevent rolling of said rolling body (56); said actuating means (28) detaching the block (59) from said surface (58) of the rolling body (56) in opposition to the elastic member (60).

8. A device as claimed in claim 1, characterized by comprising guide means (45) for guiding the base (5) and limiting travel of the base (5) on said supporting surface (26).

9. A device as claimed in claim 8, characterized in that said guide means (45) comprise two slots (46) formed in said base (5) and engaged by respective pins (47) projecting from the supporting surface (26).

10. A device as claimed in claim 9, characterized in that said slots (46) are octagonal.

* * * * *